United States Patent
Vaze (10) Patent No.: US 11,211,756 B2
(45) Date of Patent: Dec. 28, 2021

(54) ELECTRICAL CONNECTORS

(71) Applicant: ENERMORE TECHNOLOGIES LLP, Kolhapur (IN)

(72) Inventor: Girish Vaze, Kolhapur (IN)

(73) Assignee: ENERMORE TECHNOLOGIES LLP, Kolhapur (IN)

( * ) Notice: Subject to any disclaimer, the term of this patent is extended or adjusted under 35 U.S.C. 154(b) by 0 days.

(21) Appl. No.: 16/967,277

(22) PCT Filed: Dec. 19, 2019

(86) PCT No.: PCT/IN2019/050940
§ 371 (c)(1),
(2) Date: Aug. 4, 2020

(87) PCT Pub. No.: WO2021/033194
PCT Pub. Date: Feb. 25, 2021

(65) Prior Publication Data
US 2021/0050696 A1 Feb. 18, 2021

(30) Foreign Application Priority Data
Aug. 16, 2019 (IN) .............................. 201921033210

(51) Int. Cl.
*H01R 31/06* (2006.01)
*H01R 27/00* (2006.01)
(Continued)

(52) U.S. Cl.
CPC ......... *H01R 31/06* (2013.01); *H01R 13/4367* (2013.01); *H01R 13/506* (2013.01);
(Continued)

(58) Field of Classification Search
CPC ...... H01R 31/06; H01R 25/006; H01R 27/00; H01R 13/64; H01R 13/514; H01R 13/4367; H01R 13/506
See application file for complete search history.

(56) References Cited

U.S. PATENT DOCUMENTS

| | | | |
|---|---|---|---|
| 6,220,880 B1 | 4/2001 | Lee et al. | |
| 6,250,956 B1 * | 6/2001 | Pulizzi | H01R 13/743 439/535 |

(Continued)

OTHER PUBLICATIONS

International Search Report and Written Opinion dated May 7, 2020 issued in International Patent Application No. PCT/IN2019/050940.

*Primary Examiner* — Briggitte R. Hammond
(74) *Attorney, Agent, or Firm* — Morgan, Lewis & Bockius LLP (57) ABSTRACT

An electrical connector includes a non-conductive housing, electrical contacts and a flange. The non-conductive housing has spaced openings on a front face thereof configured to receive corresponding spaced members of an electrical plug. The electrical contacts include contact clips disposed in the spaced openings and configured to receive corresponding of the spaced members of the electrical plug, and contact members extending beyond the non-conductive housing and spaced independently of a spacing of the spaced members of the electrical plug to be received in the spaced openings. The flange has a predetermined shape, outlining the non-conductive housing and configured to be inserted in a correspondingly shaped standardized receptacle.

17 Claims, 8 Drawing Sheets

(51) Int. Cl.
*H01R 25/00* (2006.01)
*H01R 13/436* (2006.01)
*H01R 13/64* (2006.01)
*H01R 13/506* (2006.01)

(52) U.S. Cl.
CPC ........... *H01R 13/64* (2013.01); *H01R 25/006* (2013.01); *H01R 27/00* (2013.01)

(56) References Cited

U.S. PATENT DOCUMENTS

| | | | |
|---|---|---|---|
| 8,439,697 B2 * | 5/2013 | Vass | H01R 13/652 |
| | | | 439/346 |
| 8,469,734 B2 * | 6/2013 | Chen | H01R 13/6275 |
| | | | 439/353 |
| 9,312,673 B2 * | 4/2016 | Byrne | H02G 3/185 |
| 9,627,828 B2 | 4/2017 | Irons | |
| 10,505,325 B2 | 12/2019 | Duncan et al. | |
| D895,556 S * | 9/2020 | Byrne | D13/139.1 |
| 2003/0077928 A1 | 4/2003 | Vander Vorste et al. | |
| 2013/0196535 A1 | 8/2013 | Utz | |
| 2015/0222063 A1 | 8/2015 | Irons et al. | |
| 2017/0354053 A1 | 12/2017 | Irons et al. | |
| 2019/0140410 A1 | 5/2019 | Hutchison et al. | |

* cited by examiner

ELECTRICAL CONNECTORS

CROSS-REFERENCE TO RELATED APPLICATION

This application is the U.S. National Phase under 35 U.S.C. § 371 of International Patent Application No. PCT/IN2019/050940, filed on Dec. 19, 2019, which in turn claims priority to and the benefit of Indian Patent Application No. 201921033210, filed on Aug. 16, 2019, the entire disclosures of which are incorporated herein by reference.

TECHNICAL FIELD

The present disclosure relates to power distribution units, and in particular to electrical connectors within power distribution units.

BACKGROUND

Electrical appliance connectors are available under the standards set by International Electrotechnical Commission ("IEC), e.g., IEC-60320 connectors, and National Electrical Manufacturers Association ("NEMA"), e.g., NEMA standard receptacles. Conventionally these connectors involve a non-conductive housing and a set of electrical current carrying metallic contacts. The terminal distances and also the cabinet entry cutout/opening sizes for various standards are different so one cannot use them interchangeably on a particular cabinet. The housing and contacts are also of a separate-configuration for each type. Further, for connection or disconnection of these connectors the equipment cabinet needs to be dismantled. This becomes a limitation in itself for easy external replacement of connectors on the equipment.

A Power Distribution Unit hereafter referred to as PDU, is a device which comprises of a cabinet, a power input, an array of power outlets along with some supplementary devices like various types of light emitters, sensors, fuses or circuit breakers, monitoring, measuring modules and communication modules.

A PDU receives power from electrical source and distributes it to other electrical equipment as per requirement. Typically, PDUs contain appliance outlets and power sockets of various international standards. A more common category is of IEC-60320 outlets which are either screw mount or snap mounted type which fit into a PDU cabinet. There are different versions like C-13, C-19, C-21 and a few more. Another common category of outlets are those under NEMA standard. The outer borders of these appliance outlets vary and hence the entry cutout/openings on the cabinet are different. Each entry cutout/opening on a PDU cabinet can generally accommodate only a specific version of outlet. The same conventional PDU cannot accommodate other versions, this is a limitation.

Thus, PDUs structures and designs that allow for dynamic configuration of sockets conforming to different standards is desired.

RELEVANT REFERENCES

1. U.S. Pat. No. 8,882,536 'Chatsworth' Dated Jan. 27, 2013
2. US 2019115705 'Schneider'Dated Apr. 18, 2019
3. U.S. Pat. No. 9,627,828 B2 'Servertech' Dated Nov. 6, 2013
4. US 20190140410 'Vertiv' Dated Nov. 2, 2018

Differently sized openings on the cover plate of a typical PDU restrict the accommodation of more types of receptacles/connectors and especially those of different sizes. Hence, there is a need for an interchangeable connector assembly with more than 2 interchangeable receptacles/connectors types.

A typical rack PDU needs separate outlet adapters for every outlet type in order for the said outlet type to be configured to adapt to the C19 type outlet openings which are made on the faceplate of the outlet module of such a rack PDU. A drawback of the said outlet adapter is that the same is not Poka-yoke, i.e., mistake proof hence the same may be wrongly inserted into the outlet opening and cause damage. There is a need for a connector assembly which does not use any outlet adapters. Hence, there is a need for an interchangeable connector assembly that completely eliminates the need for outlet adapters.

Separate groups/sets of female outlet board terminals for each outlet type to be received by the PCB have been disclosed. Hence, there is a need for a connector assembly which does not use such multiple groups/sets of female outlet board terminals for each connector.

A plurality of banks which are coupled with the housing have also been disclosed. However, the entire bank needs to be replaced or interchanged as per requirement which also requires a replacement of the faceplate of the outlet module. Hence, there is a need for a connector assembly which does not require dismantling of the assembly in order to replace or interchange the outlets.

An apparatus wherein a single receptacle can be limited to be operable either as a C13 receptacle by employing a tab or can be limited to be operable as a C19 receptacle by employing a cover has also been available.

In an aspect, the present disclosure provides an interchangeable electrical connector assembly with more than two interchangeable receptacle/connector types.

In another aspect, the present disclosure provides for a mistake-elimination feature for preventing insertion of the connector in a wrong orientation with respect to the corresponding receiving standardized cutout/opening and the corresponding receptacle terminals.

In yet another aspect, the present disclosure provides an interchangeable electrical connector assembly that uses a standardized connector having contact members capable of mating with a standardized set of receptacle terminals.

In a further aspect, the present disclosure, provides an interchangeable electrical connector assembly that allows onsite replacement and interchangeability without having to change or replace a faceplate of a distribution unit (power source) cabinet.

In an aspect, the present disclosure provides an electrical connector having contact members across the applicable standards which can be mounted onto a cabinet having standardized cutout/openings and electrically connected inside the cabinet by insertion into common receptacle terminals and allows ease of interchangeability and replacement between the connectors of various standards on site and externally while maintaining safety and security.

SUMMARY

The electrical connector comprises a non-conductive housing having spaced openings on a front face thereof containing electrical contacts. The said electrical contacts comprise at its one end contact clips configured to receive correspondingly spaced and correspondingly shaped members of the electrical plug, and at its other end standardized contact members extending beyond the non-conductive housing, spaced independently of said contact clips. The said non-conductive housing has at its base a flange for adapting it to the housing of a power source.

In the said electrical connector the said flange of non-conductive housing is independent of spacing of the spaced openings on the front face thereof.

In the said electrical connector the contact clips disposed in the spaced openings of the non-conductive housing are configured to receive the spaced members of an electrical plug of an International Electrotechnical Commission (IEC) 60320 standard or a National Electrical Manufacturers Association (NEMA) standard.

In the said electrical connector a cantilevered snap-lock is disposed on the flange and extends beyond the non-conductive housing, the cantilevered snap-lock is configured to be inserted into a corresponding notch or recess in the housing of the power source.

In the said electrical connector an additional projection is disposed on the flange configured to fit in a corresponding notch or recess in the housing of the power source, the notch or recess is provided to prevent the electrical connector from being wrongly inserted into the corresponding housing of the power source.

In the said electrical connector the cantilevered snap-lock is configured to snap-fit into a corresponding housing of the power source.

A housing of a power source is configured to receive an electrical connector disclosed above. The said housing comprises of a receptacle terminal spaced and configured to receive the contact members of the electrical connector.

The said housing of a power source further comprises a notch or recess shaped and configured to receive a cantilevered snap-lock disposed on the flange of the electrical connector.

The said housing of a power source further comprises an additional notch or recess configured to receive an additional projection disposed on the flange of the electrical connector and prevents the electrical connector from being wrongly inserted into it.

The said housing of a power source further comprises a non-conductive cage disposed over the receptacle terminals and molded together to form a power cord, the said cage acts as an electrical safety barrier for a user's fingers.

A power distribution unit (PDU) comprising a cabinet which has two or more housings of a power source configured to receive two or more electrical connectors as described above; and a Printed circuit board (PCB) which has a set of receptacle terminals disposed thereon, each set is configured to receive standardized contact members of the said electrical connector. The said PDU is characterized by the fact that differently configured electrical connectors may each be interchangeably received by the said set of receptacle terminals disposed on the said PCB of the PDU.

The above power distribution unit further comprises a non-conductive cage disposed over each set of receptacle terminals that acts as an electrical safety barrier for a user's fingers.

In the above power distribution unit, each housing of the power source comprises of a notch or a recess shaped and configured to receive a cantilevered snap-lock disposed on each flange of each electrical connector as described above.

In the above power distribution unit, each housing of the power source further comprises an additional notch or recess shaped and configured to receive a corresponding additional projection disposed on the flange as described above and prevents each electrical connector from being wrongly inserted into it.

In the above power distribution unit, the board is configured to enable a user to interchange the electrical connectors received in the housing of the power source from one electrical connector receiving one type of electrical plug to another electrical connector receiving the other type of electrical plug.

DETAILED DESCRIPTION

The present disclosure will now be described with reference to the accompanying drawings wherein the same numerals are used to denote the same part. However, the drawings only illustrate the disclosure and in no way limit the disclosure.

The terms and words used in the following description and claims are not limited to the bibliographical meanings, but, are merely used by the inventor to enable a clear and consistent understanding of the disclosure. The description given herein is only representative of the illustrative embodiments and examples. Only for the sake of convenience, the description has focused on a limited number of representative examples of the drawings. However, the drawings and/or illustrations and/or the appended claims in no way limit the scope of the disclosure. It is understood that modifications and/or alterations of the drawings/illustrations of this disclosure other than those specifically set forth herein may be achieved by those skilled in the art and that such modifications and alterations are to be considered as falling within the overall scope of this disclosure.

It can be understood that when an element is referred to with "first" and "second", the element is not limited thereby. The terms "first," "second," etc. may be used only for a purpose of distinguishing the element from the other elements and may not limit the sequence or importance of the elements. In some cases, a first element may be referred to as a second element without departing from the scope of the claims set forth herein. Similarly, a second element may also be referred to as a first element.

Terms used herein are used only in order to describe an exemplary embodiment rather than limiting the present disclosure. In this case, singular forms include plural forms unless interpreted otherwise in context.

Typically Receptacles/connectors of IEC 60320 standard as well as NEMA and other similar applicable standards both with a screw mount or snap mount non-conductive housing and a set of three electrical current carrying contacts for the respective connector types have rear connecting members having a different and unique orientation for each type and each standard.

Connectors and receptacles disclosed herein facilitate versatility of connectivity of any of the connector types/standards. These have contact members which can mate with common receptacle terminals. Versatility of connectivity of any of the connector types across standards is facilitated without changing the front panel of equipment, front surface of a cabinet/panel or PCB, front surface subassembly or attached connector cord or any other part thereof. These connectors can be mounted or extracted externally, without the need for opening or dismantling of the cabinet/panel of a PDU or disconnecting the-connector cord while maintaining safety and security.

In an aspect of the present disclosure, an interchangeable electrical connector includes a non-conductive housing, electrical contacts and a flange. The non-conductive housing has spaced openings on a front face thereof configured to receive correspondingly spaced members of an electrical plug. The electrical contacts include contact clips disposed in the spaced openings and configured to receive corresponding of the spaced members of the electrical plug, and contact members extending beyond the non-conductive housing and spaced independently of a spacing of the spaced members of the electrical plug to be received in the spaced openings. The flange has a predetermined shape, outlining the non-conductive housing and configured to be received in a correspondingly shaped standardized receptacle. In an embodiment the standardized receptacle may be formed as a standardized cutout/opening.

In one aspect, an electrical connector includes a non-conductive housing, electrical contacts and a flange. The non-conductive housing has spaced openings on a front face thereof configured to receive corresponding spaced members of an electrical plug. The electrical contacts include contact clips disposed in the spaced openings and configured to receive corresponding of the spaced members of the electrical plug, and contact members extending beyond the non-conductive housing and spaced independently of a spacing of the spaced members of the electrical plug to be received in the spaced openings. The flange has a predetermined shape, outlining the non-conductive housing and configured to be inserted in a correspondingly shaped standardized receptacle. In an embodiment the standardized receptacle may be formed as a standardized cutout/opening.

In another aspect, an electrical connector includes a non-conductive housing, electrical contacts & a flange. In an embodiment, the non-conductive housing has spaced notches, e.g., on at least one side which can be used for locking.

In an embodiment, the predetermined shape of the flange is independent of a shape of the non-conductive housing and a spacing of the spaced openings. In an embodiment, the spaced openings of the non-conductive housing are configured to receive an electrical plug of an International Electrotechnical Commission (IEC) 60320 standard or a National Electrical Manufacturers Association (NEMA) standard. In an embodiment, the electrical connector further includes a cantilevered snap-lock disposed on the flange and extending beyond the non-conductive housing, the cantilevered snap-lock being configured to be inserted into a corresponding standardized cutout/opening in the standardized receptacle. In an embodiment a projection is additionally provided on at least one side on the back of flange and is positioned such as to fit into a corresponding notch or recess in the entry cut-out/opening of standardized receptacle. The notch or recess in the standardized receptacle is configured and positioned to prevent the interchangeable electrical connector from being wrongly inserted into the standardized receptacle. In other words, this projection is provided which acts as a means of fool-proofing against wrong fitment of interchangeable connector into the entry cut-out/opening.

In an embodiment, the cantilevered snap-lock is configured to snap-fit into a corresponding entry cut-out/opening in the standardized receptacle. In an embodiment, a non-conductive cover is disposed on a portion of the electrical contacts between the contact clips and the contact members and configured to electrically insulate the electrical contacts from each other.

In another aspect, a standardized receptacle is configured to receive an interchangeable connector described herein and includes receptacle terminals spaced and configured to receive the contact members of the interchangeable connector. In an embodiment, the standardized receptacle further includes identical notches shaped and configured to receive a cantilevered snap-lock disposed on a flange of the interchangeable connector. In an embodiment, the identical notches or recesses are shaped and positioned independent of a type of electrical plug to be received in the electrical connector. In an embodiment, another notch is also provided in the cut-out/opening of standardized receptacle on other side at right angle to the notches meant for receipt of cantilevered snap-lock disposed on a flange of the interchangeable connector. This notch acts as a means of foolproofing against wrong fitment of interchangeable connector into standardized receptacle. In an embodiment, a non-conductive cover is disposed over the receptacle terminals and is configured to electrically insulate the receptacle terminals from each other.

In another aspect, a power distribution unit includes a housing comprising standardized openings each configured to receive an interchangeable connector configured to receive an electrical plug, and a board having a set of standardized receptacle terminals disposed thereon. Each set of the standardized receptacle terminals corresponds to a standardized opening and is configured to receive contact members of the electrical connector. The receptacle terminals in each set of standardized receptacle terminals are spaced independently of a spacing of members the electrical plug being received in the electrical connector. In an embodiment, the power distribution unit further includes a non-conductive cover disposed over each set of the standardized receptacle terminals and configured to electrically insulate the receptacle terminals from each other. In an embodiment, each of the standardized openings includes notches shaped and configured to receive a cantilevered snap-lock disposed on the flange of the interchangeable connector. In an embodiment, includes notches shaped and positioned independent of a type of electrical plug to be received in the interchangeable connector. In an embodiment, each set of the standardized receptacle terminals is configured to enable the corresponding interchangeable connector to receive an electrical plug conforming to an International Electrotechnical Commission (IEC) 60320 standard or a National Electrical Manufacturers Association (NEMA) standard. In an embodiment, the board is configured to enable a user to change the interchangeable connector received in the standardized openings from a first interchangeable connector receiving a first type of electrical plug to a second interchangeable connector receiving a second type of electrical plug different from the first electrical plug while the board receives power.

As used herein, the term "standardized" refers to a condition where the relative spacing, shape and other physical and structural characteristics of the "standardized" component are fixed. It must be noted that in the context of the present disclosure, the phrase "standardized" does not necessarily mean compliance with an accepted standard, but rather to an arbitrary standard that allows uniformity within the various elements disclosed herein. Thus, unless otherwise stated explicitly or made clear by context, the term "standardized" or "standard" as used herein does not refer to any accepted standard.

Various embodiments of the electrical connectors, receptacles, power distributions, etc., disclosed herein are described with reference to the accompanying drawings.

Figure 1:
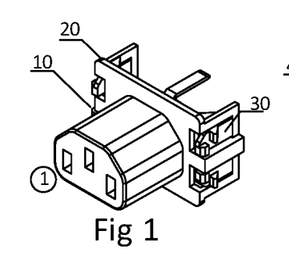
FIG. 1 is a perspective view of assembly of Interchangeable Connector 1 of IEC-60320 comprising a C-13 type non-conductive housing 10, notches 10A/10B on either side usable for locking type plug connector, common flange 20, projection 20A and common cantilevered snap-lock 30.
Figure 7:
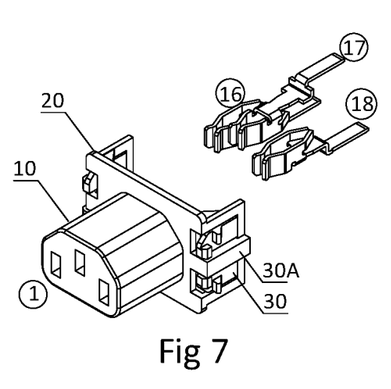
FIG. 7 is an exploded perspective view of the assembly of Interchangeable Connector 1 of IEC-60320 comprising a C-13 type non-conductive housing 10, common flange 20, projection 20A at one side on the back of flange 20, common cantilevered snap-lock 30 and set of contacts 16, 17 and 18.
Figure 8:
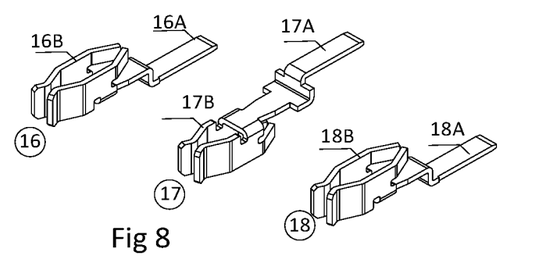
FIG. 8 is the perspective view of the set of contacts 16, 17 and 18 comprising contact clips 16B, 17B and 18B and common contact members 16A, 17A and 18A respectively.

Referring to the drawings, the Interchangeable Connector 1 of IEC-60320 as shown in FIG. 1 comprises of a C-13 type non-conductive housing 10, flange 20, projection 20A at one side on the back of flange 20 common cantilevered snap-lock 30 and set of contacts 16, 17 and 18 as shown in FIG. 7. The set of contacts 16, 17 and 18 comprise of contact clips 16B, 17B and 18B and common contact members 16A, 17A and 18A respectively as shown in FIG. 8.

Figure 2:
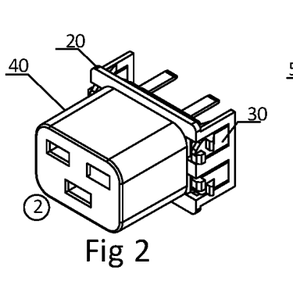
FIG. 2 is a perspective view of assembly of Interchangeable Connector 2 of IEC-60320 comprising a C-19 type non-conductive housing 40, notches 40A/40B on either side usable for locking type plug connector, common flange 20, projection 20A and common cantilevered snap-lock 30.
Figure 9:
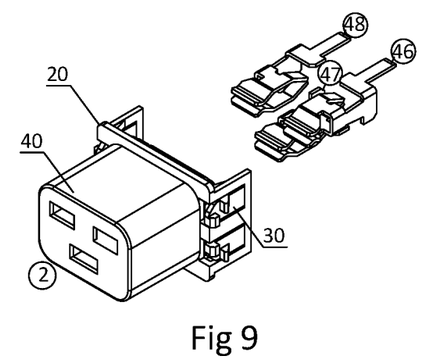
FIG. 9 is the exploded perspective view of assembly of Interchangeable Connector 2 of IEC-60320 comprising a C-19 type non-conductive housing 40, common flange 20, projection 20A at one side on the back of flange 20, common cantilevered snap-lock 30 and set of contacts 46, 47 and 48.
Figure 10:
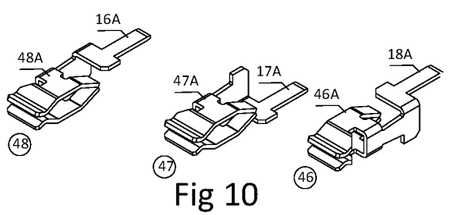
FIG. 10 is the perspective view of the set of contacts 46, 47 and 48 comprising contact clips 46B, 47B and 48B and common contact members 16A, 17A and 18A respectively.

Similarly the Interchangeable Connector 2 of IEC-60320 as shown in FIG. 2 comprises of a C-19 type non-conductive housing 40, flange 20, projection 20A at one side on the back of flange 20 common cantilevered snap-lock 30 and set of contacts 46, 47 and 48 as shown in FIG. 9. The set of contacts 46, 47 and 48 comprise of contact clips 46B, 47B and 48B and common contact members 16A, 17A and 18A respectively as shown in FIG. 10.

Figure 3:
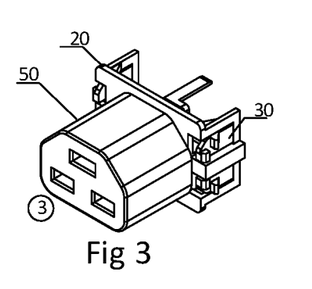
FIG. 3 is a perspective view of assembly of Interchangeable Connector 3 of IEC-60320 comprising a C-21 type non-conductive housing 50, notches 50A/50B on either side usable for locking type plug connector, common flange 20, projection 20A and common cantilevered snap-lock 30.
Figure 11:
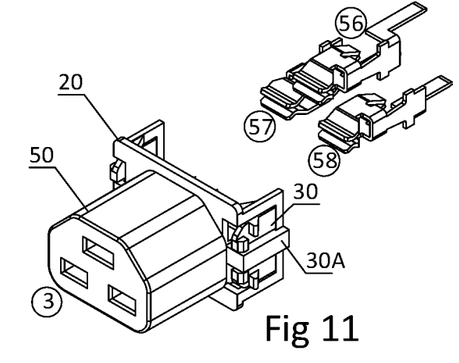
FIG. 11 is the exploded perspective view of assembly of Interchangeable Connector 3 of IEC-60320 comprising a C-21 type non-conductive housing 50, common flange 20, projection 20A at one side on the back of flange 20, common cantilevered snap-lock 30 and set of contacts 56, 57 and 58.
Figure 12:
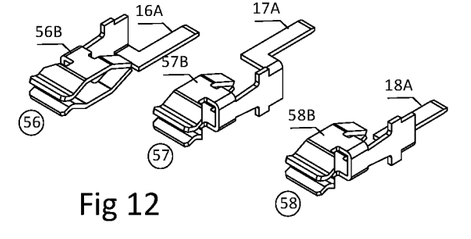
FIG. 12 is the perspective view of the set of contacts 56, 57 and 58 comprising contact clips 56B, 57B and 58B and common contact members 16A, 17A and 18A respectively.

Similarly the Interchangeable Connector 3 of IEC-60320 as shown in FIG. 3 comprises of a C-21 type non-conductive housing 50, flange 20, projection 20A at one side on the back of flange 20 common cantilevered snap-lock 30 and set of contacts 56, 57 and 58 as shown in FIG. 11. The set of contacts 56, 57 and 58 comprise of contact clips 56B, 57B and 58B and common contact members 16A, 17A and 18A respectively as shown in FIG. 12.

Figure 4:
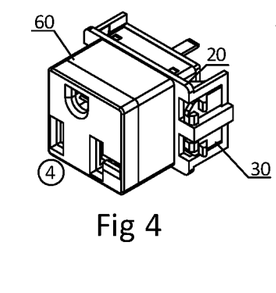
FIG. 4 is a perspective view of assembly of Interchangeable Connector 4 of NEMA comprising a straight blade 5-20R type non-conductive housing 60 having the common flange 20, projection 20A and a set of common cantilevered snap-lock 30.
Figure 13:
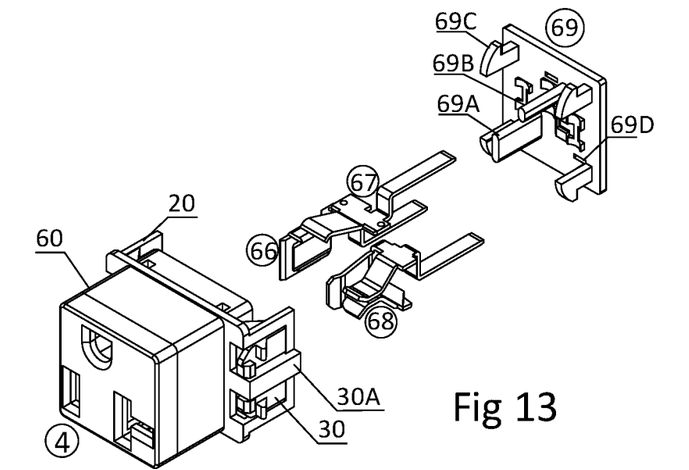
FIG. 13 is the exploded perspective view of assembly of Interchangeable Connector 4 of NEMA comprising a straight blade 5-20R type non-conductive housing 60, common flange 20, projection 20A at one side on the back of flange 20, a set of common cantilevered snap-lock 30, a set of contacts 66, 67 & 68, a non-conductive cover 69, projecting ribs 69A & 69B, a set of cantilevered snap-lock 69C and a set of entry slots 69D.
Figure 14:
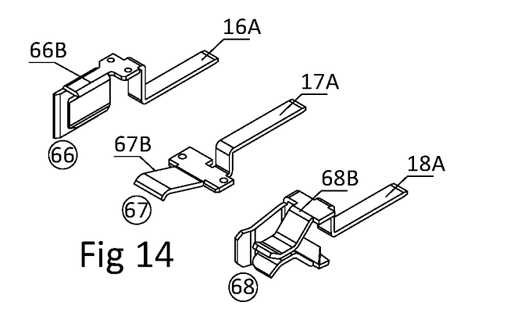
FIG. 14 is the partial perspective view of the set of contacts 66, 67 and 68 comprising contact clips 66B, 67B and 68B and common contact members 16A, 17A and 18A respectively.

The Interchangeable Connector 4 of NEMA as shown in FIG. 4 comprises of a straight blade 5-20R type non-conductive housing 60 having the flange 20, projection 20A at one side on the back of flange 20 a set of common cantilevered snap-lock 30, a set of contacts 66, 67 & 68 along with a non-conductive cover 69 as shown in FIG. 13. The set of contacts 66, 67 and 68 comprising contact clips 66B, 67B and 68B and common contact members 16A, 17A and 18A as shown in FIG. 14. There are projecting ribs 69A & 69B on the non-conductive cover 69 which act as an insulating barrier between the adjacent contacts at the same time they also act as a means of fool proofing against wrong fitment of non-conductive cover during assembly. There is a set of cantilevered snap-lock 69C on the non-conductive cover 69 which fits inside the non-conductive housing 70 and act as a means of positive retention of non-conductive cover 69 into non-conductive housing 60. The non-conductive cover 69 is also provided with a set of entry slots 69D through which the common contact members 16A, 17A & 18A pass. The non-conductive cover 69 arrests any axial movement of the contacts 66, 67 & 68 after assembly.

Figure 5:
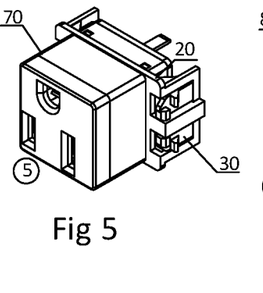
FIG. 5 is a perspective view of the assembly of Interchangeable Connector 5 of NEMA straight blade 5-15R type non-conductive housing 70 having the common flange 20, projection 20A and a set of common cantilevered snap-lock 30.
Figure 15:
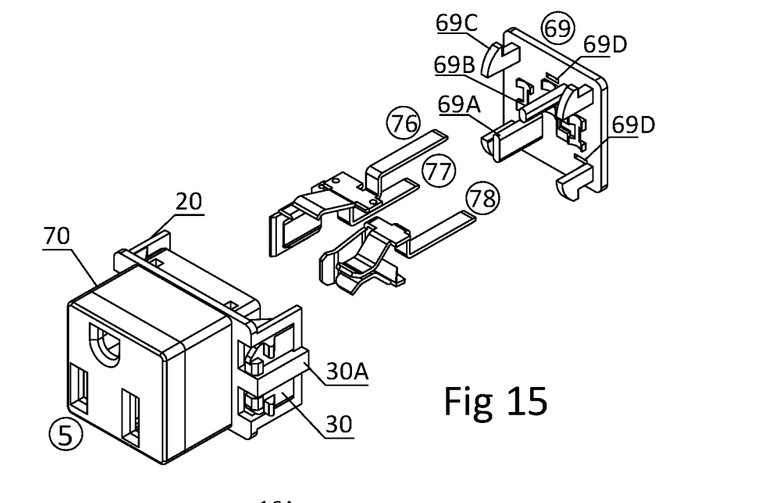
FIG. 15 is the exploded perspective view of assembly of Interchangeable Connector 5 of NEMA comprising a straight blade 5-15R type non-conductive housing 70 having the common flange 20, projection 20A at one side on the back of flange 20 and a set of common cantilevered snap-lock 30 a set of contacts 76, 77 & 78, non-conductive cover 69, projecting ribs 69A & 69B, a set of cantilevered snap-lock 69C, a set of entry slots 69D.
Figure 16:
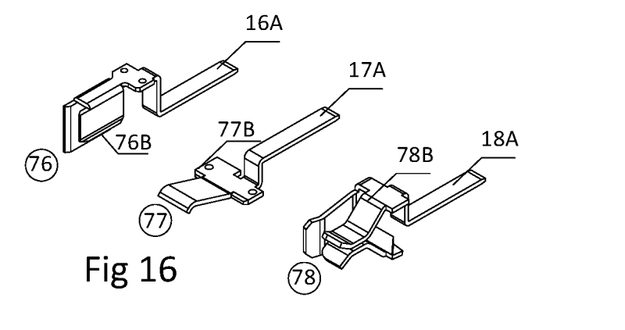
FIG. 16 is the partial perspective view of the set of contacts 76, 77 and 78 comprising contact clips 76B, 77B and 78B and common contact members 16A, 17A and 18A respectively.

Similarly the Interchangeable Connector 5 of NEMA as shown in FIG. 5 comprises of a straight blade 5-15R type non-conductive housing 70 having the flange 20, projection 20A at one side on the back of flange 20, a set of common cantilevered snap-lock 30, a set of contacts 76, 77 & 78 along with a non-conductive cover 69 as shown in FIG. 15. The set of contacts 76, 77 and 78 comprise of contact clips 76B, 77B and 78B and common contact members 16A, 17A and 18A as shown in FIG. 16. There are projecting ribs 69A & 69B on the non-conductive cover 69 which act as an insulating barrier between the adjacent contacts at the same time they also act as a means of fool proofing against wrong fitment of non-conductive cover 69 during assembly. There is a set of cantilevered snap-lock 69C on the non-conductive cover 69 which fits inside the non-conductive housing 70 and acts as a means of positive retention of cover 69 into non-conductive housing. The non-conductive cover 69 is also provided with a set of entry slots 69D through which the common contact members 16A, 17A & 18A pass. The non-conductive cover arrests any axial movement of these contacts after assembly.

Figure 6:
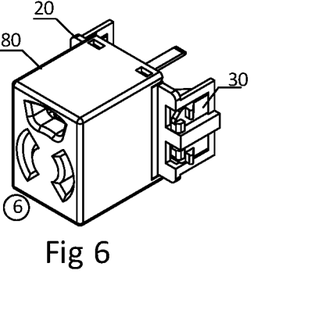
FIG. 6 is a perspective view of assembly of Interchangeable Connector 6 of NEMA comprising a twist lock 5-15R type non-conductive housing 80, non-conductive cover 89 having common flange 20, projection 20A and common cantilevered snap-lock 30.
Figure 17:
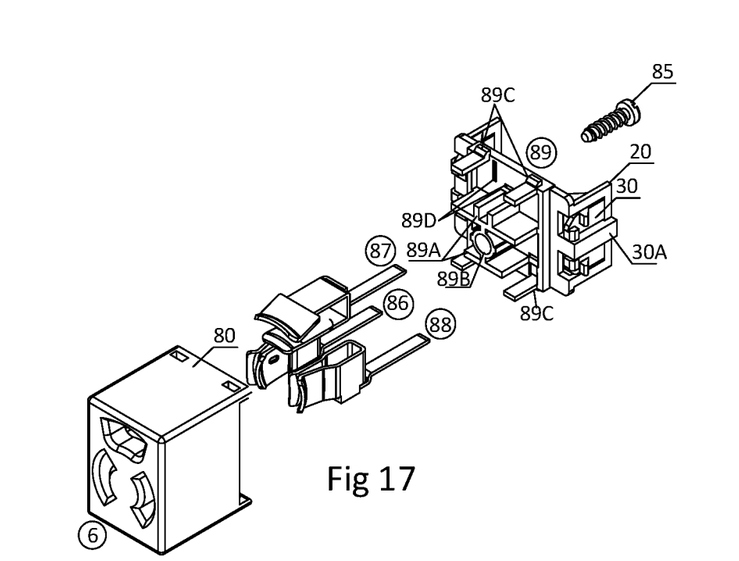
FIG. 17 is an exploded perspective view of assembly of Interchangeable Connector 6 of NEMA comprising a twist lock 5-15R type non-conductive housing 80, non-conductive cover 89 having common flange 20, projection 20A at one side on the back of flange 20 and common cantilevered snap-locks 30, a set of contacts 86, 87 and 88, a barrier 89A, a set of cantilevered snap-lock 89C on non-conductive cover 89, a set of entry slots 89D, screw 85 and screw hole 89B.
Figure 18:
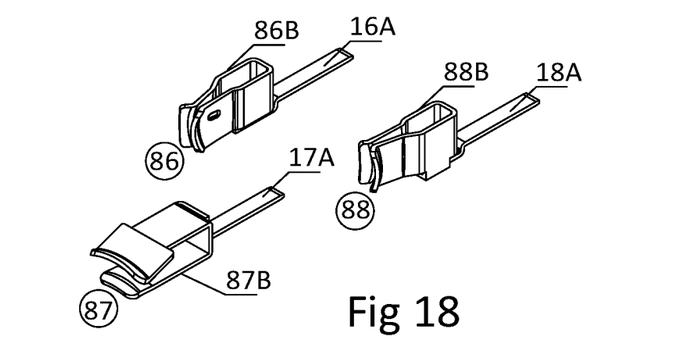
FIG. 18 is the exploded perspective view of the set of contacts 86, 87 and 88 comprising contact clips 86B, 87B and 88B and common contact members 16A, 17A and 18A respectively.

The Interchangeable Connector 6 of NEMA as shown in FIG. 6 comprises of a twist lock 5-15R type non-conductive housing 80, non-conductive cover 89 having flange 20 and common cantilevered snap-lock 30, a set of contacts 86, 87 and 88 as shown in FIG. 17. The set of contacts 86, 87 and 88 comprise of contact clips 86B, 87B and 88B and common contact members 16A, 17A and 18A as shown in FIG. 18. There is a barrier 89A which act as an insulator between the adjacent metallic contacts at the same time they also act as a means of fool proofing against wrong fitment of non-conductive cover 89 during assembly. There is a set of snap-lock 89C on non-conductive cover 89 which fits inside the non-conductive housing 80 and act as a means of positive retention of cover 89 into non-conductive housing. The non-conductive cover 89 is also provided with a set of entry slots 89D through which the common contact members 16A, 17A & 18A pass. Screw 85 fixes the non-conductive cover 89 onto the non-conductive housing 80 through the screw hole 89B and arrests any axial movement of the contacts 86, 87 and 88 after assembly. A projection 20A is provided along at least one side on the back of flange 20 which acts as a means of fool proofing against wrong fitment of interchangeable connector into standardized receptacle.

Figure 19:
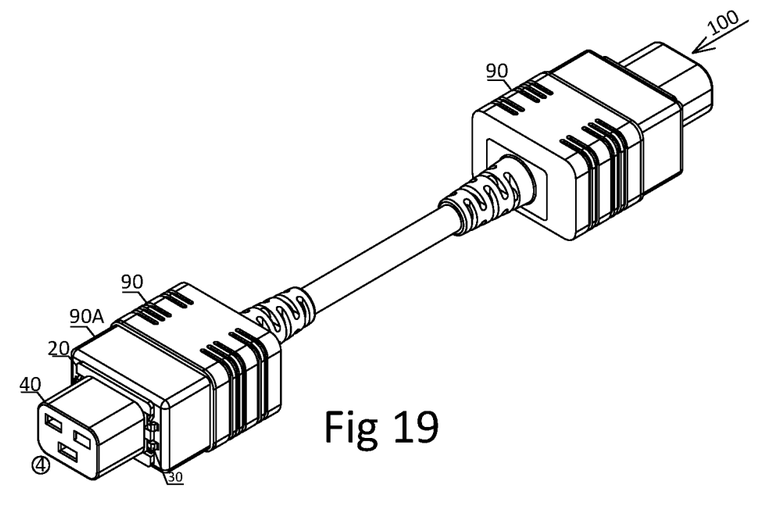
FIG. 19 is a perspective view of an embodiment of the present disclosure with a molded connector cord comprising a molded non-conductive housing 90, Connector 2 including non-conductive housing 40, common flange 20, and common cantilevered snap-lock 30, shroud 90A having standardized cutout/opening.
Figure 26:
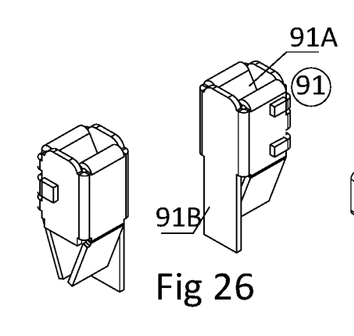
FIG. 26 is a partial perspective view of the receptacle terminal 91 wherein 91A are fork arms of the female receptacle terminal and 91B is the tip of the receptacle terminal.
Figure 27:
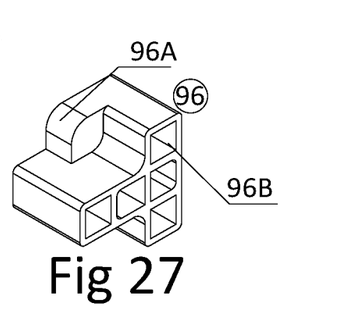
FIG. 27 is a perspective view of the non-conductive safety cage 96 which is fitted onto the PCB through round openings 181 as shown in FIG. 24.
Figure 28:
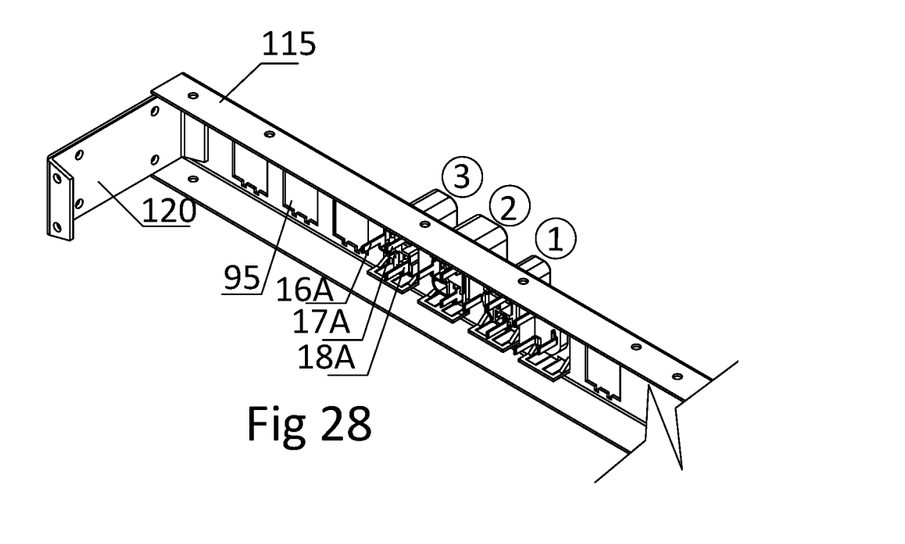
FIG. 28 is a perspective view of the front panel 115 of cabinet shown from inside showing the, end cover 120, common contact members 16A, 17A and 18A, standardized cutout/opening 95 and interchangeable connectors 1, 2 and 3.

FIG. 19 is one of the preferred embodiments of the present disclosure wherein a molded connector cord comprising a molded non-conductive housing 90 holds the receptacle terminals 91. The receptacle terminals 91 are female receptacle terminals comprising of fork arm 91A and tip 91B as shown in FIG. 26 which are attached to the cable from inside and subsequently insert molded in the molded connector cord the other end of the connector cord is connected to a power source 100.

Figure 20:
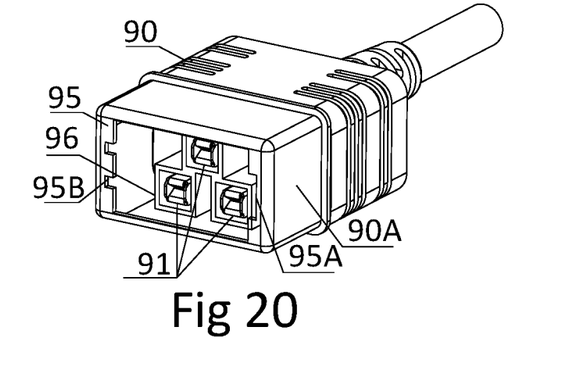
FIG. 20 is a partial perspective view of an embodiment of the present disclosure with a molded connector cord showing the molded non-conductive housing 90, the receptacle terminals 91, standardized cutout/opening 95, shroud 90A, notches 95A & 95B and non-conductive safety cage 96.
Figure 21:
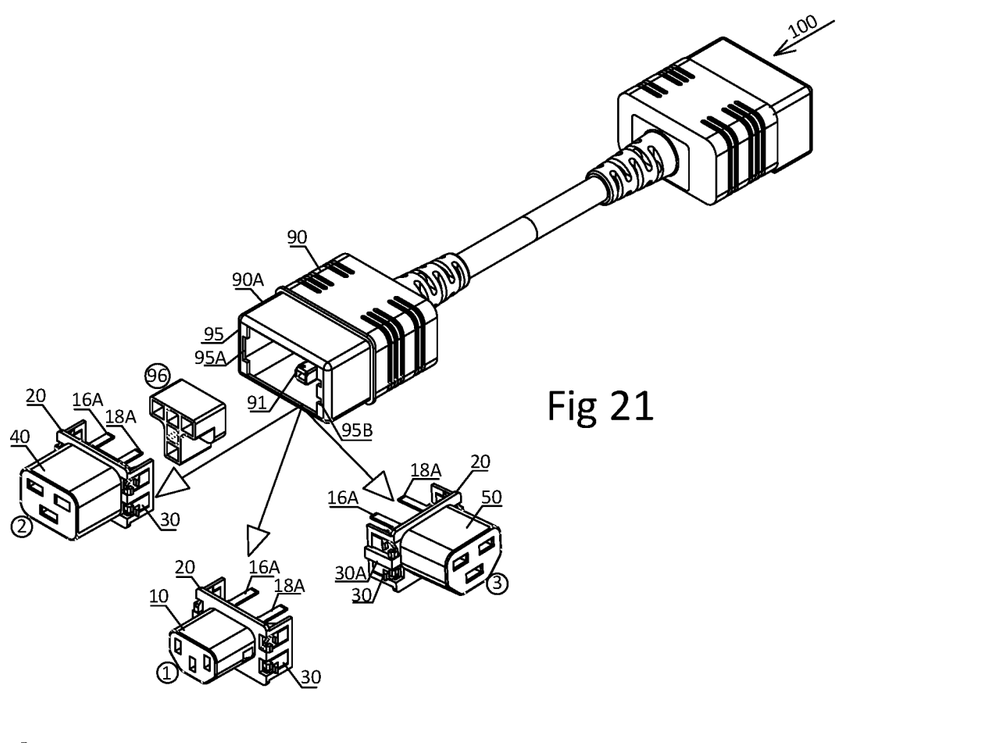
FIG. 21 is an exploded perspective view of an embodiment of the present disclosure with a molded connector cord showing molded non-conductive housing 90, receptacle terminals 91, standardized cutout/opening 95, shroud 90A, notches 95A & 95B. Common cantilevered snap-lock 30, common flange 20, common contact member 17A of replaceable connectors 1, 2 and 3, non-conductive safety cage 96 and power source 100.

In the present disclosure shroud 90A is an extended portion of the non-conductive housing 90. The shroud 90A has a standardized cutout/opening 95 as shown in FIG. 20. The Interchangeable Connectors 1, 2, 3, 4, 5 and 6 having common contact members 16A, 17A and 18A are coupled with the fork arm 91A of receptacle terminals 91 through the standardized cutout/opening 95. The Interchangeable Connector 2 as shown in FIG. 19 may be interchanged with other interchangeable connectors 1, 2, 3, 4, 5 and 6 as described in FIGS. 1, 2, 3, 4, 5 and 6 respectively since all of the interchangeable connectors have the common flange 20, common cantilevered snap-lock 30 and use common contact members 16A, 17A and 18A.

In order to achieve mistake proofing against wrongful fitment of connectors, the interchangeable connectors 1, 2, 3, 4, 5 and 6 have a projection 20A provided along at least one side on the back of flange 20 shown in FIGS. 7, 9, 11, 13, 15 and 17. The standardized cutout/opening 95 on shroud or housing 90 has notch/recess 95A provided for the entry of the common cantilevered snap-lock 30. The notch/recess 95B is provided on other side of the cut-out/opening of standardized receptacle. The interchangeable connectors 1, 2, 3, 4, 5 and 6 can be coupled to the receptacle terminals 91 through the standardized cutout/opening 95 only if the projection 20A is inserted into notch/recess 95B shown in FIG. 20.

Additionally, none of the existing connector assemblies includes a safety feature to protect the user if the power supply remains ON when the connectors are being adapted, replaced or interchanged on site. A non-conductive safety cage 96 is fitted to or included in the non-conductive housing 90 of the molded connector cord which surrounds the receptacle terminals 91 and acts as an electrical safety barrier for the user's fingers.

Figure 22:
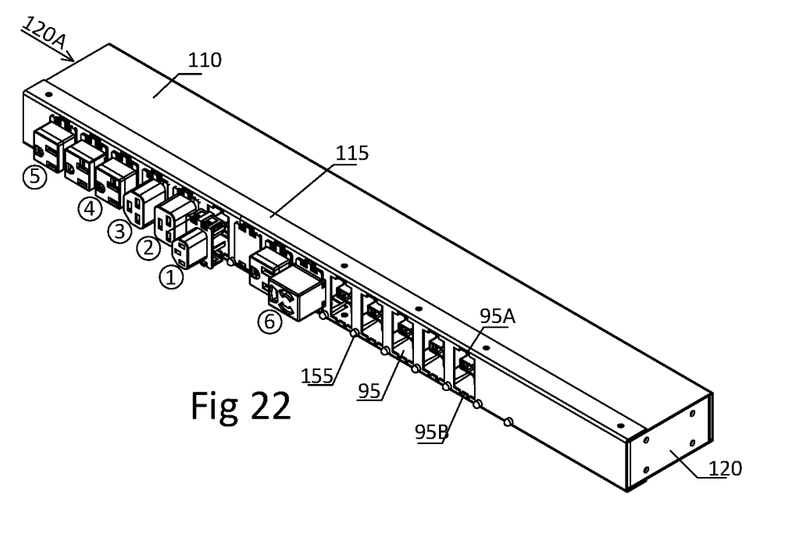
FIG. 22 is a perspective view of an embodiment of the present disclosure with assembly of a Power Distribution Unit (PDU) with replaceable connectors 1, 2, 3, 4, 5 and 6 as shown in FIGS. 1, 2, 3, 4, 5 and 6, a bottom panel 110, a front panel 115, end cover 120, standardized cutout/openings 95, notches 95A & 95B, light pipes 155 and another end cover 120A having entry opening for power source.

FIG. 22 is another preferred embodiment of the present disclosure wherein a Power Distribution Unit (PDU) cabinet is formed out of a bottom panel 110, a front panel 115, end cover 120 on one side and another end cover 120A on the other side consisting of an opening for cable entry connected to a power source 100.

The front panel 115 is provided with standardized cutout/openings 95 placed at certain predetermined distance through which interchangeable connectors are coupled. The light pipes 155 are inserted in the hole openings pierced on the front panel 115 of the cabinet. In an embodiment, one or more light emitting diodes (LEDs) may be inserted in the hole openings instead of the light pipes. In such embodiments, the light pipes or the LEDs provide an indication of whether the receptacle terminals corresponding to the particular standardized opening/cutout are receiving power or not. The interchangeable connectors can be 1 to 3 of IEC-60320 standards as shown in FIGS. 1, 2 and 3 or as per NEMA straight blade interchangeable connectors 4, 5 and 6 as shown in FIGS. 4, 5 and 6 or other applicable standards.

Figure 23:
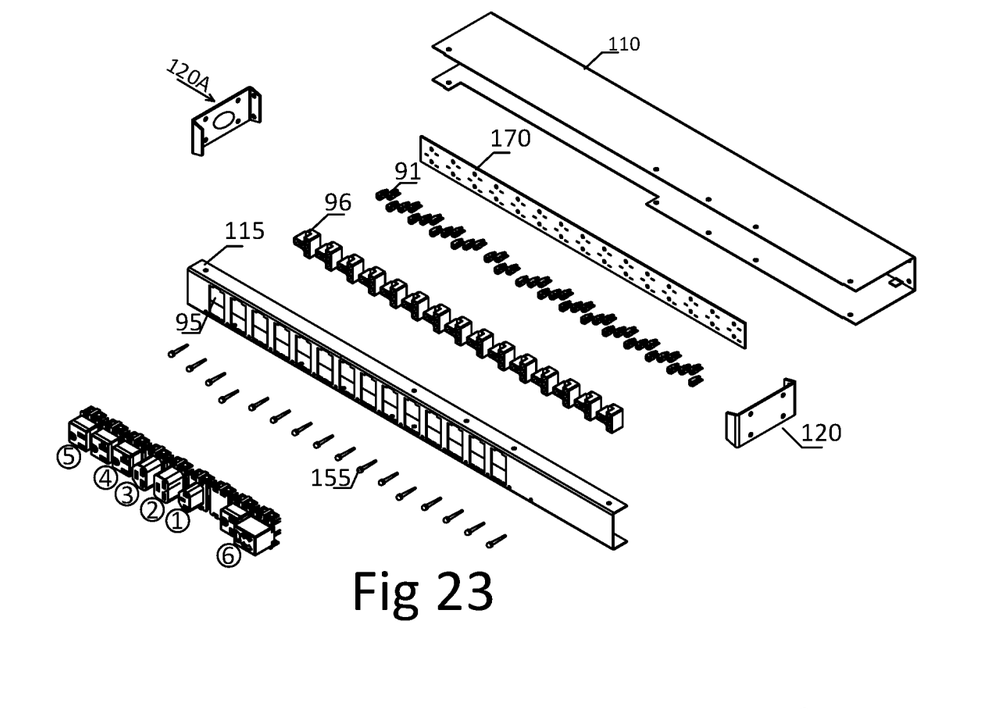
FIG. 23 is an exploded perspective view of the assembly of a PDU with interchangeable connectors 1, 2, 3, 4, 5 and 6 as shown in FIGS. 1, 2, 3, 4, 5 and 6, a bottom panel 110, a front panel 115, end cover 120, end cover 120A having entry opening for power source, standardized cutout/openings 95, light pipes 155, Printed Circuit Board (PCB) board 170, receptacle terminals 91 and non-conductive safety cage 96.
Figure 24:
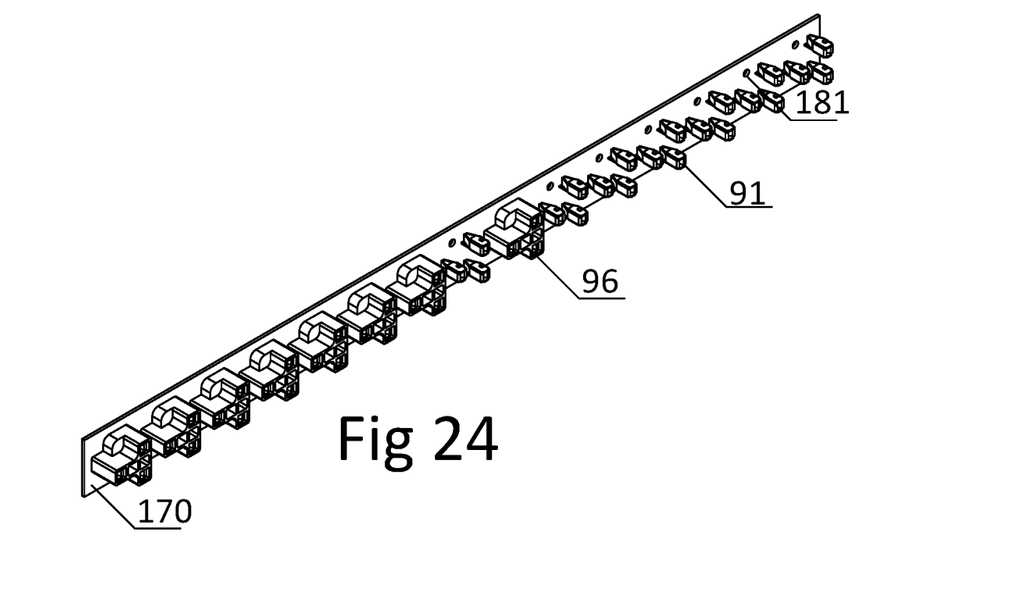
FIG. 24 is a partial perspective view of the PCB 170, round openings 181, receptacle terminals 91 and non-conductive safety cage 96.
Figure 25:
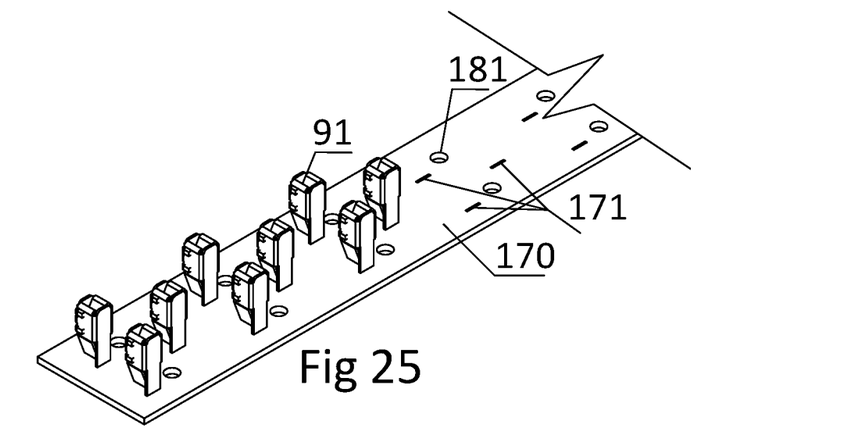
FIG. 25 is a partial perspective view of the PCB 170, entry slots 171, round openings 181 and receptacle terminals 91.

The Printed Circuit Board (PCB) 170, receptacle terminals 91 and non-conductive safety cage 96 as shown in FIGS. 23, 24 and 25 are placed inside the front panel 115 which is then fitted on the bottom panel 110. The PDU cabinet is then screwed at various locations for firm fitment. Interchangeable connectors 1, 2, 3, 4, 5 and 6 are coupled through the standardized cutout/opening 95 by pushing inside so that the common contact members 16A, 17A, 18A get coupled with the fork arm 91A of receptacle terminals 91 on PCB as shown in FIG. 26 and electrical connection is established.

An embodiment of the present disclosure also includes Poka-yoke feature i.e. mistake proofing. The connectors 1, 2, 3, 4, 5 and 6 cannot be wrongly inserted into the standardized cutout/opening 95. The standardized cutout/opening 95 provided on the front panel 115 has a notch/recess 95B provided on only one side. The interchangeable connectors 1, 2, 3, 4, 5 and 6 shall be coupled to the receptacle terminals 91 through the standardized cutout/opening 95 only if the projection 20A is inserted into notch/recess 95B shown in FIG. 22.

In the present disclosure PCB has entry slots 171 through which the receptacle terminal tips 91B are inserted and fixed onto the PCB Board, round openings 181 for fitment of non-conductive safety cage 96 onto the PCB as shown in FIGS. 24 and 25. The positions of receptacle terminals 91 and the non-conductive safety cage 96 on PCB is determined by the entry slots 171 and the round openings 181 respectively. There is a uniform pattern of slots 171 and round opening 181 throughout the PCB 170 where the receptacle terminals 91 and non-conductive safety cage 96 are respectively fixed as well as a uniform pattern of standardized cutout/opening 95 on the front panel 115. The relative positions of the standardized cutout/opening 95 and the receptacle terminals 91 along with the non-conductive safety cage 96 is such that the common contact members 16A, 17A and 18A on any of the interchangeable connectors 1, 2, 3, 4, 5 and 6 can be accommodated on any of the said standardized cutout/openings 95.

Therefore, there is no need for additional receptacle terminals 91 on the PCB 170 to accommodate connectors of different standards and types. There is also no need for a single receptacle to be limited to be operable either as a C13 receptacle by employing a tab or be limited to be operable as a C19 receptacle by employing a cover, the present disclosure also allows compatibility across various standards and types.

The said connectors can therefore be used with equipment cabinets having standardized entry cutout/openings or can be mounted as a connector for use with molded connector cords having a standardized receptacle. The connectors as disclosed above have been judiciously combined with the equipment cabinets as disclosed above and/or molded connector cords as disclosed above to work in synergy.

Another limitation in conventional PDUs is the use of appliance outlets having shroud/lip and collar which is coupled in the cabinet entry cutout/openings and outlet fitment with the cabinet occurs in the shroud/lip portion. The outlet extends and penetrates inside the cabinet from PDU surface. Consequently, the depth of cabinet is greater in order to accommodate the outlet in it.

This limitation is addressed in an embodiment of the present disclosure comprising of interchangeable connectors 1, 2, 3, 4, 5 and 6. The connectors are coupled through the standardized cutout/opening 95 on cabinet such that the non-conductive housing of interchangeable connectors 1, 2, 3, 4, 5 and 6 of IEC 60320 standard or NEMA of any other applicable standard shall be above the front panel 115. Therefore, the mating portion of interchangeable connectors with the respective plug connector cords as per applicable standard extends away from outer surface of PDU cabinet which impart an advantage of compact cabinet depth.

Advantages of the Disclosure

An advantage of the present disclosure is that the connectors/receptacles can be replaced externally hence the same can be done on site.

Another advantage of the present disclosure is that the common flange of connectors/receptacles across applicable standards allows onsite interchange of the connectors/receptacles.

Another advantage of the present disclosure is that there is a common configuration of the contact members of the contacts of the connectors/receptacles across applicable standards enabling interchangeability of connector, across applicable standards, on an existing panel or PDU. Contacts can be coupled with common receptacle terminals on a PCB or a busbar assembly or a wire.

Another advantage of the present disclosure is that there is no need of dismantling the assembly or cabinet or a subassembly in order to replace or interchange the outlets.

Another advantage of the present disclosure is that it provides an ease of orientation of connectors in either linear or gang manner by arranging the cutouts/openings suitably on the equipment cabinet or panel mount as per need.

Another advantage of the present disclosure is that there is no outer lip on the receptacles/connectors which saves space.

Examples

In another embodiment of the present disclosure the receptacles/connectors of IEC 60320 standard as well as NEMA and other similar applicable standards can be electrically connected by direct soldering of the common contact members on a PCB or a wire; wherein the contact members are common across all applicable standards.

In another embodiment of the present disclosure for ease of orientation of connectors in either linear or gang or other manner the standardized cutouts/openings may be arranged on the equipment front surface of a cabinet/panel or PCB as per the requirement.

In another embodiment of the present disclosure the PCB assembly is placed in the bottom panel of the cabinet of a PDU and the front panel is then fitted on the bottom panel and fixed at various locations for firm fitment.

In another embodiment of the present disclosure the receptacle terminal tips are inserted through the entry slots and fixed on the PCB.

In yet another embodiment the interchangeable connector as per disclosed invention can be electrically connected to a set of busbars without a PCB being used. Corresponding entry slots are configured on a set of busbars as per predetermined standardized spacings.

What is claimed is:

1. An electrical connector comprising:
    a non-conductive housing having spaced openings on a front face thereof containing electrical contacts,
    the electrical contacts comprising:
    at a first end portion, contact clips configured to receive correspondingly spaced and correspondingly shaped members of an electrical plug, and
    at a second end portion opposite the first end portion, standardized contact members extending beyond the non-conductive housing, spaced independently of the contact clips;
    the non-conductive housing having at a base thereof a flange for adapting the non-conductive housing to a housing of a power source, the flange comprising a snap-lock disposed thereon, the snap-lock extending beyond the non-conductive housing.

2. The electrical connector of claim 1, wherein the flange of the non-conductive housing is independent of spacing of the spaced openings on the front face thereof.

3. The electrical connector of claim 1, wherein the contact clips disposed in the spaced openings of the non-conductive housing are configured to receive the spaced members of an electrical plug of an International Electrotechnical Commission (IEC) 60320 standard or a National Electrical Manufacturers Association (NEMA) standard.

4. A housing of a power source configured to receive an electrical connector of claim 1, comprising:
    receptacle terminals spaced and configured to receive the contact members of the electrical connector.

5. The housing of a power source of claim 4, further comprising a non-conductive cage disposed over the receptacle terminals and molded together to form a power cord, the said cage acts as an electrical safety barrier for a user's fingers.

6. The housing of a power source of claim 4, further comprising a notch or recess shaped and configured to receive a portion of the snap-lock disposed on the flange of the electrical connector.

7. The housing of a power source of claim 6, further comprising an additional notch or recess configured to receive an additional projection disposed on the flange of the electrical connector and prevents the electrical connector from being wrongly inserted thereinto.

8. A power distribution unit comprising:
    a cabinet having two or more housings of a power source configured to receive two or more electrical connectors of claim 1; and
    a board, having a set of receptacle terminals disposed thereon, each set being configured to receive standardized contact members of the electrical connector enabling differently configured electrical connectors to each be interchangeably received by the set of receptacle terminals disposed thereon.

9. The power distribution unit of claim 8, further comprising a non-conductive cage disposed over each set of receptacle terminals, the non-conductive cage acting as an electrical safety barrier for a user's fingers.

10. The power distribution unit of claim 8, wherein each housing of the power source comprises a notch or recess shaped and configured to receive a portion of the snap-lock disposed on each flange at the base of the non-conductive housing of each electrical connector.

11. The power distribution unit of claim 8, wherein each housing of the power source comprises a notch or recess shaped and configured to receive a cantilevered snap-lock disposed on each flange of the non-conductive housing of each electrical connector and the flange is independent of spacing of the spaced openings on the front face of the electrical connector.

12. The power distribution unit of claim 8, wherein each housing of the power source further comprises an additional notch or recess shaped and configured to receive a corresponding additional projection disposed on the flange and prevents each electrical connector from being wrongly inserted thereinto, wherein the flange has a cantilevered snap-lock disposed thereon and extending beyond the non-conductive housing, the cantilevered snap-lock being configured to be inserted into a corresponding notch or recess in that housing.

13. The power distribution unit of claim 8, wherein the board is configured to enable a user to interchange the electrical connectors received in the housing of the power source from one electrical connector receiving one type of electrical plug to another electrical connector receiving another type of electrical plug.

14. The electrical connector of claim 1, wherein the snap-lock comprises a cantilevered snap-lock disposed on the flange and configured to be inserted into a corresponding notch or recess in the housing of the power source.

15. The electrical connector of claim 14, wherein the cantilevered snap-lock is configured to snap-fit into the housing of the power source.

16. The electrical connector of claim 14, further comprising an additional projection disposed on the flange configured to fit in a corresponding additional notch or recess in the housing of the power source, the additional notch or recess being provided to prevent the electrical connector from being wrongly inserted into the corresponding housing of the power source.

17. An electrical connector comprising:
    a non-conductive housing having spaced openings on a front face thereof containing electrical contacts,
    the electrical contacts comprising:
    at a first end portion, contact clips configured to receive correspondingly spaced and correspondingly shaped members of an electrical plug, and
    at a second end portion opposite the first end portion, standardized contact members extending beyond the non-conductive housing, spaced independently of the contact clips;
    the non-conductive housing having at a base thereof a flange for adapting the non-conductive housing to a housing of a power source, the flange comprising a snap-lock disposed thereon, the snap-lock extending beyond the non-conductive housing and being configured to enable extraction of the non-conductive housing externally from the housing of the power source.

* * * * *